United States Patent
Plecher et al.

(10) Patent No.: US 7,175,105 B2
(45) Date of Patent: Feb. 13, 2007

(54) ACTUATOR FOR A FUEL INJECTOR OF AN INTERNAL COMBUSTION ENGINE

(75) Inventors: Klaus Plecher, Zeitlarn (DE); Marcus Unruh, Zeitlarn (DE)

(73) Assignee: Siemens Aktiengesellschaft, Munich (DE)

( * ) Notice: Subject to any disclaimer, the term of this patent is extended or adjusted under 35 U.S.C. 154(b) by 251 days.

(21) Appl. No.: 10/961,293

(22) Filed: Oct. 8, 2004

(65) Prior Publication Data

US 2006/0038030 A1    Feb. 23, 2006

Related U.S. Application Data

(60) Provisional application No. 60/603,426, filed on Aug. 20, 2004.

(30) Foreign Application Priority Data

Aug. 20, 2004  (DE)  ..................... 10 2004 040 492
Sep. 24, 2004  (EP)  ..................... 04104655

(51) Int. Cl.
   *B05B 1/08*    (2006.01)
(52) U.S. Cl. ............... 239/102.2; 239/102.1; 239/533.2; 239/585.1; 310/326; 251/129.06; 123/498

(58) Field of Classification Search ............. 239/102.1, 239/102.2, 533.2, 585.1; 251/129.06; 310/326, 310/327; 123/498
See application file for complete search history.

(56) References Cited

U.S. PATENT DOCUMENTS

| | | | | |
|---|---|---|---|---|
| 3,418,980 A | * | 12/1968 | Benson | 123/294 |
| 4,803,393 A | * | 2/1989 | Takahashi | 310/328 |
| 6,424,078 B1 | * | 7/2002 | Heinz | 310/328 |
| 6,585,171 B1 | * | 7/2003 | Boecking | 239/102.1 |
| 7,066,399 B2 | * | 6/2006 | Hohl | 239/102.2 |
| 2006/0038031 A1 | * | 2/2006 | Unruh | 239/102.2 |

FOREIGN PATENT DOCUMENTS

DE    102 51 225 A1    5/2004

* cited by examiner

*Primary Examiner*—Eric Keasel
*Assistant Examiner*—Trevor McGraw
(74) *Attorney, Agent, or Firm*—Baker Botts L.L.P.

(57) ABSTRACT

In order to increase the lifetime for a piezoactuator of a fuel injector and to make possible a reliable seal of the piezoactor especially for comparatively thin head plates as well a gas exchange passage running through an actuator housing (52, 54) is provided, where a sealing unit (2) placed on the head arrangement (16, 18) is provided for sealing the piezoactor (12) which features a carrier (28) on which a sealing material (30) is arranged which forms a seal around the piezo contact pins (14) and the head arrangement (16, 18) and on which a microporous gas exchanger (26) to create gas permeability of the sealing unit (24) is integrated such that any fluid which has penetrated through to the gas exchanger (26) can flow out of the gas exchanger (26) under the force of gravity.

23 Claims, 2 Drawing Sheets

ACTUATOR FOR A FUEL INJECTOR OF AN INTERNAL COMBUSTION ENGINE

PRIORITY

This application claims priority to U.S. Provisional Application 60/603,426 filed Aug. 20, 2004; German application no. 10 2004 040 492.5 filed Aug. 20, 2004; and, European application no. 04104655.8 filed Sep. 24, 2004.

TECHNICAL FIELD OF THE INVENTION

The present invention relates to an injector for an internal combustion engine.

DESCRIPTION OF THE RELATED ART

An actuator of this type is known for example from DE 102 51 225 A1. In this prior art, to create a durable, especially oil-tight seal between a piezoactor and external contacts for the actuator, the use of a fuel-resistant sealing ring (O-ring) in each opening of a head plate placed on top of it is proposed. In each through-opening a sleeve made of insulating material is also used below the sealing ring which effectively centers and electrically isolates the contact pin.

The disadvantage of this known piezoactor seal is that this requires a comparatively thick head plate to enable both a sealing ring and a centering sleeve to be accommodated in its through-openings. In addition, the actuator sealed in the known way has a limited life.

SUMMARY OF THE INVENTION

The object of the present invention is thus to develop an actuator of the type mentioned at the start such that its life is extended, and to make possible a reliable seal of the piezoactor, especially for comparatively thin head plates.

The actuator in accordance with the invention is characterized in that at least one gas exchange passage running through an actuator housing is provided, via which an exchange of gas between the outside and the inside of the actuator housing is made possible, and that a sealing unit placed on the head arrangement and with openings to allow the contact pins to pass through for sealing the piezoactor is provided, which features a carrier on which a sealing material is arranged which seals against the outside surfaces of the contact pin and against a surrounding surface of the head arrangement, and on which a gas exchanger made of microporous material to create a gas permeability of the sealing unit is integrated in such a way that, in the mounting position of the actuator any fluid penetrating into the gas exchanger can flow out of the gas exchanger under gravitational influence, especially for example can flow out again at least partly via the gas exchange passage from the actuator housing. This latter object can be achieved in a plurality of ways by providing a passage which, in the mounting position of the actuator, "runs downwards" from the gas exchanger (e.g. by a heightened or inclined arrangement of the external surface of the gas exchanger).

The sealing system around both the outer surfaces of the connecting pins and also on the head arrangement makes it possible to obtain a reliable fluid seal. This seal lies outside the area delimited by the through openings of the head arrangement, so that regardless of this restricted available mounting space a higher level of design freedom is provided and this seal is especially suitable even for comparatively thin head plates.

As regards the assembly of a fuel injector, the invention advantageously makes possible the implementation of the sealing of a piezoactor equipped with one or more contact pins by fitting one single component (sealing unit).

The increased constructional design freedom which is produced by making the seal outside the restricted space of the through openings is further utilized in accordance with the invention to create a gas permeability through a part made of microporous material integrated into the carrier (gas exchanger).

A preferred use of the seal arrangement is produced for the piezoactor of a fuel injector of an internal combustion engine, in which the fuel injector and at least one further component of a fuel injection device is essentially entirely arranged within a motor block module of the internal combustion engine. This means in particular the case in which there are components of the injection device accommodated within the engine block module which, without restricting their function, could also be accommodated outside the latter. The term "engine block module" in this case refers to the totality of components containing engine lubricating oil, that is the "engine block" in the narrower sense and parts mounted on it (such as a cylinder head cover etc.), into which the lubricating oil is pumped or lubricates or is fed (back). With this type of engine construction there is an increased danger of "damaging media" such as oil and/or fuel entering the inside of the injector house or an "actor space". This is a particular problem for example with common-rail diesel engines with injection components lying within the cylinder head cover.

In internal operational trials by the applicant it surprisingly transpired that the arrangement of a piezoceramic component such as of the piezoactor which is of interest here in an actuator housing which is as "gas-tight as possible" in an installation environment which features damaging media does not in practice increase the lifetime of the component but even tends to shorten it. The same is true of the attempt to enclose the piezoactor in an actor housing (actor space) which is "as gas-tight as possible" which in its turn is accommodated within a non-sealed actuator housing.

By contrast, by a degree of gas conductivity in the area of the sealing arrangement it is possible to significantly extend the durability or lifetime of the piezoactor. A possible explanation lies in the fact that, with an actuator housing or actor housing which has the most gas-tight seal possible, under certain operating conditions there is a vacuum in the inside of the housing (e.g. through temperature variations) through which damaging media can get into the inside of the housing through the seal which in practice is not to be formed absolutely hermetically. Other possible explanations lie in the fact for example that, after the manufacture of a hermetically-sealed piezoactor the concentration of any gas which shortens the lifetime in the inside of the piezoactor increases or that a filling of the space inside the housing with a gas similar to atmospheric air has a positive effect on the life of the piezoelectric ceramic.

Through the integration of the microporous material for which there is provision in accordance with the invention a certain gas porosity or pressure equalization capability of the sealing arrangement and thereby the advantageous effect of a lengthening of the durability or the lifetime of the piezoactor is achieved.

The integration of the gas permeable part on the carrier is preferably provided such that at least one gas exchange path through the sealing unit is produced, in the course of which lies the microporous material, but no carrier material and no sealing material. This means that the gas exchanging capability of the sealing arrangement is essentially achieved independently of the carrier material and the sealing material. The latter materials can then be selected so that they are especially suitable for their relevant tasks.

Even though it is entirely possible to select a sealing material with greater gas permeability (e.g. silicon or fluorosilicon material) to increase the gas permeability of the sealing unit, this is for example in general not necessary in favor of a sealing material optimized with respect to mechanical and thermal properties, since the gas permeability is implemented through the separate gas exchanger provided.

Since the actuator in accordance with the invention is embodied such that any fluid that has penetrated into the gas exchanger can flow out of the gas exchanger under the force of gravity, the operability of the gas exchanger is in any event slightly impeded by fluid which is (only at times) on the outside of the gas exchanger (e.g. motor oil, motor oil thinned by petrol, water). The gas exchange passage running through the actuator housing preferably forms an outflow path "running downwards" for any fluids that have penetrated it.

Plastic can for example be used as the material for the carrier.

The use of an elastomer is preferred for the sealing material for example to achieve a permanently pre-tensioned sealing system on the contact pins and on the head arrangement.

To allow simple manufacturing the sealing material can be formed as a injection molding around the carrier. Alternatively the sealing material arranged on the carrier can be provided partly or completely as one component in a two-component injection molding process.

There is provision in an embodiment for an internal connection to be made between the carrier and the sealing material through a vulcanizing process.

In particular when the connection between the sealing material and the carrier does not yet provide a particularly good seal as such at the sealing unit, that is when these materials merely lie against each other at the sealing unit, then it is preferable if—at least in the installed state—the sealing material is compressed against the carrier.

This type of compression in the assembled state of a fuel injector can for example be implemented by exercising pressure through what is known as a contact module which is used for further electrical connection of the contact pins to an outside contact point (e.g. a connector) of the actuator. Alternatively or in addition to such compression the sealing unit can be effectively implemented by component of the sealing unit provided specifically for this purpose, connected to the carrier.

A compression of those sections of the sealing material which are against the contact pins (radial sealing), as well as those sections of the sealing material which are against the head arrangement (axial sealing), has the advantage of allowing the sealing effect to be improved.

In a preferred embodiment there is provision, in the case of radial sealing, for the sealing material to be against the surrounding surfaces of the contact pin sections with elastic pre-tension. This can be simply implemented for forming an elastic material with openings to allow the contact pins to pass through and for each cross sectional surface of the opening to be smaller in the untensioned state of the sealing material than the cross-sectional surface of the contact pin section in the area of the radial seal.

A compact design of the sealing unit is produced for example if both the radial seal and also the axial seal are provided in the corresponding areas of an overall sealing unit body embodied essentially in a disk-shape. For the disk level, to achieve an especially reliable radial seal, sections of the carrier and/or of the sealing material can extend in an axial direction along the contact pins (surrounding them). This design allows an enlarged radial sealing surface and/or a greater radial sealing force effected by the elastic pre-tensioning of the sealing material to be achieved. Furthermore an axially-projecting carrier section can protrude from the disk level, on which the microporous gas exchanger is arranged at a "higher level", e.g. in an upper end area of such a raised carrier section. Alternatively or in addition an outside surface of the gas exchanger inclined or convex (against the horizontal direction) can be provided.

In an especially compact embodiment there is provision for the side of the sealing unit facing the head arrangement to essentially follow the contours of the head arrangement. Preferably the sealing material lies at least in the ring around the circumference of the head arrangement to form a seal to ensure that axial sealing is provided. The sealing material can in this case for example be embodied in one piece in the form of a disk where the body of the disk features a central opening for creating a gas exchange passage leading to the gas exchanger as well as two further eccentric openings to allow the contact pins to pass through or to provide a radial seal for them.

In a known way the head arrangement can comprise a head plate in which the openings of the head arrangement are provided to allow the contact pins to pass through.

In a preferred embodiment the piezoactor is accommodated in an actor space which is formed from a sleeve-shaped actor housing as well as a head plate and a base plate arranged on either end of this actor housing. The head plate can in this case be placed on one axial end of the actor housing and welded to it, in which case the base plate is introduced into the actor housing so that it can be moved axially. Within such an actor space the piezoactor can be held under axial pressure pre-tension in an axial coil spring extended lengthwise which is welded at either end to the head plate and the base plate. The base plate can be embodied as part of an effective connection working towards an activation element of a fuel injection valve. In this area the seal of the actor space can be made in a way which is known per se through a membrane welded between the inner wall of the actor housing and the base plate.

To ensure a reliable axial seal the sealing material can for example be compressed in at least a ring-shaped area surrounding the contact pins axially towards the head arrangement, e.g. against the axial end of the above-mentioned actor housing.

Such compression in the area of the axial seal can for example be provided by exercising axial pressure from a contact module arranged at the upper end of the injector housing for electrical connection of the injector. There is provision in an embodiment for such a contact module to press the sealing material at least in part against the head arrangement. This sealing material section clamped between the contact module and the head arrangement can then provide the axial seal.

The axial seal can be made in a simple way by clamping of a circular enclosed areas of the sealing material between the contact module and the head arrangement. The pressing on of the sealing material against the head arrangement occurs in a well defined way if the contact module is provided for this purpose with one or more projections facing the sealing unit which, when the fuel injector is assembled, lead to the desired compression of the corresponding sealing material sections.

A simple assembly of the contact module in which the compression of the sealing material explained above can be guaranteed is produced if the contact module engages with a circumferential area of the head arrangement and is held on the circumferential area by a tight-fitting connection. This tight-fitting connection can especially be provided as a latching connection such that the pressure from the contact module causes it to latch with the head arrangement. The latching connection can for example be provided as a ring running around the circumference or also by a plurality of separate latching areas distributed around the circumference. An especially durable and close axial seal is produced if the latching connection is fixed afterwards into a final plastic injection molding. The shrinking of the plastic material increases the pressure force and thereby the clamping force exerted on the sealing material.

There is provision in an embodiment for an insulating disk provided with openings to allow the contact pins to pass through and made of electrically-isolating material to be arranged between the sealing unit and the head arrangement. The requirements for electrical isolation capability of the sealing unit components (especially sealing material) can thereby be reduced. In addition the "effective actor space volume" can be enlarged through the presence of such an insulation disc by a more-or-less large gap being provided between such an insulation disc and the adjoining components, such as for example a head plate and the sealing unit. Such gaps are often produced compulsorily in practice. In internal operational trials by the applicant it has transpired that the arrangement of a piezoceramic component "with air" in an actor space volume (as large as possible) can tend to extend the life of the component in practice.

The insulating disk can further feature cut-outs creating cavities. Such cut-outs can also be suitably provided to promote the gas exchange between the axially opposite sides of the insulation disk. If cavities are additionally present above or below the insulation disc or will be provided, cut-outs going through the insulation disk provide a greater contiguous cavity space which is advantageous for the durability of the piezoactor. The insulation disk can be manufactured particularly cheaply, e.g. from plastic as an injection-molded part and can, through sleeve continuations extending into the openings of the head arrangement, simultaneously provide insulation in the area of the head arrangement. With such an insulation disk a greater freedom in the choice of materials for the sealing unit is produced since the electrical current is forced to take a "detour" depending on the geometrical design of the insulating desk.

In a preferred embodiment a contact module such as the one mentioned above is provided with an opening or a cut-out through which or into which the section of the carrier projecting axially featuring the gas exchanger made of microporous material extends. Thus the option of gravitational outflow of the fluid from the gas exchanger, especially from the actuator housing, can be ensured in a particularly effective and simple way. It is preferred here that the gas exchanger is arranged at the upper end of a carrier section projecting upwards. It should be noted in this context that the typical mounting position of an actuator or of the fuel injector formed by it is provided such that the axial direction of the actuator features a vertical component.

In a further development there is provision for the actuator housing to feature an actuator housing section, especially a bell-shaped section, surrounding the axial projecting carrier section (e.g. one extending through the opening of the contact module). Such a "housing bell" can for example be implemented by a wall surrounding this carrier section in a circumferential direction with a small radial gap. This for example avoids fluid which has penetrated via the gas exchange passage of the actuator housing (e.g. motor oil) being able to rise in the wave up to the microporous gas exchanger. The bell-shaped actuator housing should in this case (with little play) be closed at the top so that the diving bell principle advantageously comes into play. Any rise of the fluid in the inside of the bell compresses the volume of air which is within it so that a further increase in the fluid is countered by the buildup of counter pressure (even if this is small in some cases). Also with a suitable mounting position of the actuator in the area of an internal combustion engine this principle remains effective as long as the angle of inclination relative to the vertical direction does not exceed a specific value which depends on the geometry (e.g. length) of the bell-shaped housing section.

The connection between the microporous material and the carrier material should where possible be an internal (tight) fit. In a preferred embodiment the complete exchanger formed from the microporous material is thus welded to the carrier.

Such welding is suitable for example for integration of a gas exchanger made from ePTFE (expanded Polytetra fluorethyl). This material has shown itself to be very beneficial at preventing "damaging media" such as fuel (diesel, petrol, etc) or lubricants (e.g. motor oil) from penetrating into the actor space and at the same time allowing gaseous materials out of the actor space and air or oxygen to diffuse into the actor space. Other microporous materials that can be used here are well-known to the expert and thus require no further explanation.

For a simple construction of the sealing arrangement it is of advantage for the gas exchanger to be essentially disk shaped, for example embodied as a membrane. This type of gas exchanger disc can for example extend over the entire cross-section of a through opening of the sealing unit and be welded around the circumference to the adjoining material (e.g. carrier material) (e.g. by means of ultrasound welding, laser welding, etc.). Alternatively the disk can be also inserted through an encircling sealing press-fit adapter into such a through opening.

BRIEF DESCRIPTION OF THE DRAWINGS

The invention is explained in more detail below on the basis of a number of exemplary embodiments with reference to the enclosed drawings. The Figures show.

DETAILED DESCRIPTION OF THE
PREFERRED EMBODIMENTS

Figure 1:
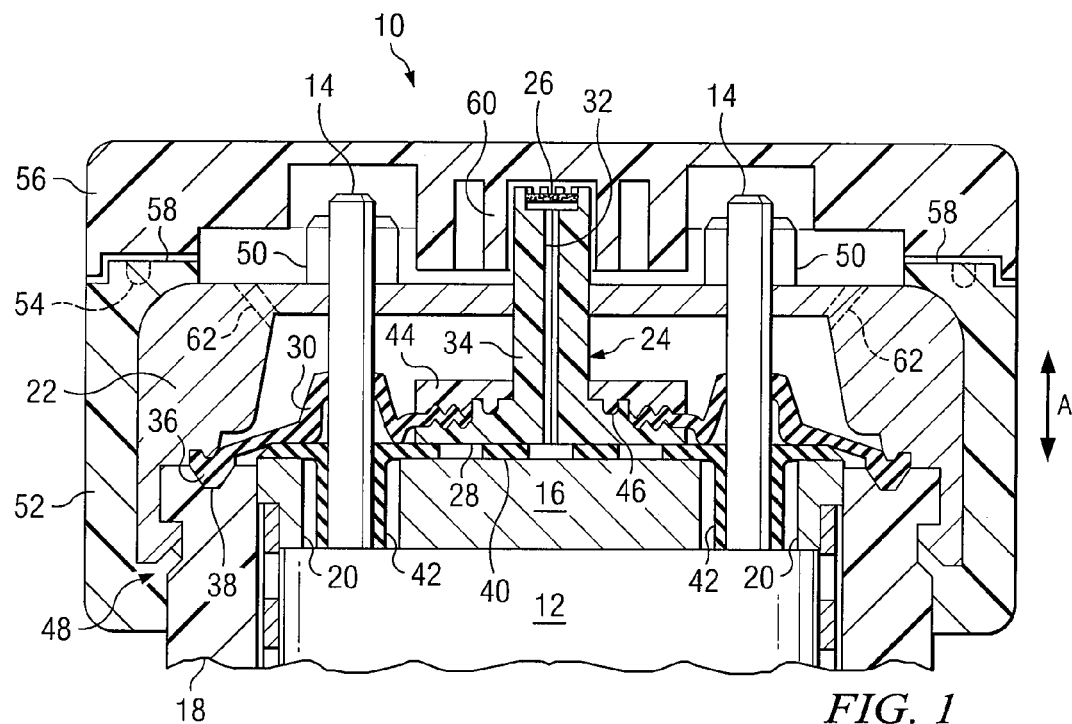
FIG. 1 a side view of an upper end section of an actuator for a fuel injector.

FIG. 1 shows a sealing arrangement 10 for sealing a piezoactor 12 formed from a piezoelement stack extending in an axial direction A which serves as an actuating component of an actuator for a fuel injector of an internal combustion engine.

Figure 2:
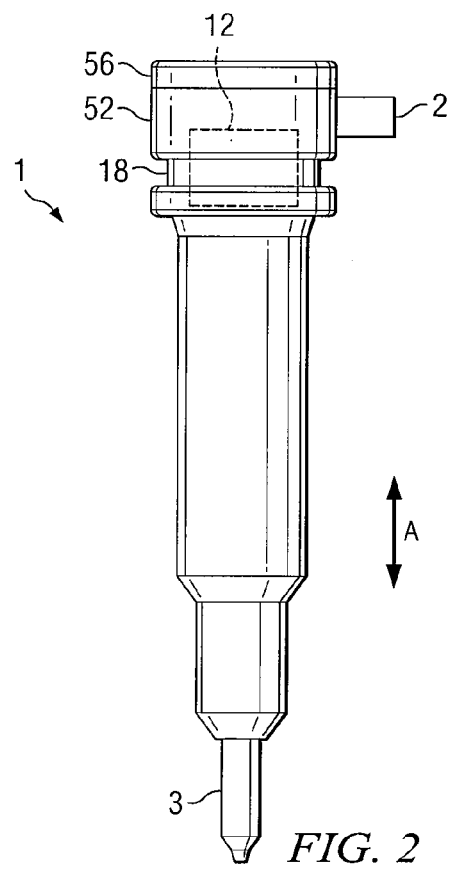
FIG. 2 a schematic view of a fuel injector provided with an actuator.

FIG. 2. illustrates the installation environment of the piezoactor 12 in the fuel injector 1 which at its upper end features a connector 2 for which the contacts are connected via a contact module arranged in a housing arrangement 52, 56 electrically to the end of contact pins (cf. FIG. 1) of the piezoactor 12.

Via an effective connection at the lower end of the piezoactor 12 a fuel injection valve (e.g. hydraulic servo valve) arranged in the lower area of the injector 1 is actuated to inject fuel via an injection nozzle 3 into the combustion chamber of the internal combustion engine.

In FIG. 1 the contact pins 14 projecting from the piezoactor 12 and a head arrangement 16, 18 placed on the piezoactor 12, can be seen, which in the example shown consist of a head plate 16 and the upper end of a sleeve-shaped actor housing 18, and which is provided with holes 20 to allow the contact pins 14 to pass through.

For a diesel injector of a common rail system integrated completely into a cylinder head of an internal combustion engine in particular a seal must be provided for the piezoactor 12 which reliably seals the actor space above the contact pin contacting (to the outside electrical connection) against the intrusion of fluids. Otherwise there is the danger of "harmful media" such as motor or oil petrol-thinned motor oil and water being able to penetrate into the actor space via the electrical further connection of the contact pins 14 to the contact module 22 providing external contacting. It has been shown however that a greatest possible gas permeation of "volatile materials" out of the actor space and air or oxygen into the actor space can tend to increase the durability or lifetime of the piezoactor 12 located in the actor space.

The good fluid seal demanded with simultaneous creation of gas permeability is implemented with the sealing arrangement 10 shown, by fitting (inserting) a sealing unit 24 between the head arrangement 16, 18 and the contact module 22.

The multi-part sealing unit 24 pre-installed as an assembly component essentially comprises three materials or sealing unit components which are combined internally in the installed state of the sealing unit, namely a microporous membrane 26 made from ePTFE, a carrier 28 made from plastic to which the microporous membrane is welded around the circumference, as well as a seal (shown as one piece in the example) 30 made from an elastomer. With this sealing material 30 with which the sealing unit on one side seals against the circumferential surfaces of the contact pins 14 and on the other side against a facing circumferential area of the head arrangement 16, 18 a reliable fluid-proof seal against the intrusion of damaging media from the environment of the fuel injector into the actor space below the head plate 16 is provided.

In the example shown the sealing material 30 embodied as a molding around the sleeve-shaped carrier 28 as well as the carrier 28 itself are provided in the center with an axial gas exchange opening 32 passing through them in the course of which gas-permeable ePTFE membrane 26 welded all around to the inner wall of the section 34 of the carrier 28 pointing upwards is arranged.

With the sealing unit 24 a unit that is simple to handle during installation of the fuel injector is thus created by means of which a large permeation or diffusion of gaseous media will be permitted and simultaneously an intrusion of fluid media into the actor space is suppressed.

The carrier 28 has the main task of providing an "interface" between the sealing material 30 and the gas exchanger 26 and of mechanically stabilizing the sealing unit 24. This is especially in respect of the microporous membrane 26 which as a filter element is very susceptible to mechanical damage. Since the carrier 28 is not essential for the purposes of the sealing effect a comparatively free choice of material can be made for it. In the example shown a significant material requirement is merely the weldability with the material of the membrane 26 as well as a good sealing effect on the edges between the carrier material and the sealing material 30.

For further stabilizing and to protect the membrane 26, by contrast with the exemplary embodiment shown, a protective cover can also be provided over the membrane 26 which for example is connected by welding (see e.g. ultrasound welding) permanently to the upper end of the carrier section 34. So that the cover hinders the gas exchange which occurs via the membrane 26 as little as possible such a cover can be embodied as a "protective grid". Such a cover also gives the membrane 26 good protection in the case where the sealing unit 24 is inserted as part of an automatic manufacturing process for a fuel injector.

The material of the seal 30 lies with elastic pre-tension against the surrounding surfaces of the contact pins 14. This is implemented by the seal 30 being embodied with openings to allow the contact pins 14 to pass through and by each opening cross-section surface in the untensioned state of the seal 30 being smaller than the cross-section surface of the relevant contact pin section in the area of the radial seal.

The reliable axial seal is made in the exemplary embodiment shown by a circular projection protruding downwards (sealing lip) 36 being pressed into a corresponding circular groove 38 of the actor housing 18. This compression in the area of the axial seal is provided by exercising axial pressure of a plastic body of the contact module 22. The contact module 22 presses the seal 30 at its outside circumference axially against the actor housing 18 so that the sections of the seal under load are clamped between the contact module 22 and the actor housing 18.

The material used for the seal 30 (here: elastomer) is electrically insulating. Through this choice of material no particular precautions need be taken against an insufficient electrical insulation of the contact pins 14 in the case in which the head arrangement 16, 18 is electrically conducting. The latter is the case as a rule since the head is usually made of metallic materials. For the case in which with an electrically-conducting head arrangement 16, 18 the material of the seals 30 or the carrier material 28 is not sufficiently electrically insulated, there can be provision—as shown—that at least in the areas of the contact of the sealing unit 24, especially of the seal 30 against the head arrangement 16, 18, the head arrangement is electrically insulated, e.g. is provided with an insulation layer or an insulation section. This insulation layer is embodied here as an insulation disk 40 which extends close to the area of the circumference of the head arrangement 16, 18 and also features openings to allow the contact pins 14 to pass through as well as further openings ("perforated insulation disk"). The insulation disk 40 it advantageously provided with sleeve extensions projecting downwards 42 (formed in one piece) which extend into the holes 20 of head plate 16 to insulate the contact pins 14 there from the inner walls of these holes 20 and to center them.

In the exemplary embodiment shown of the sealing unit 24 the inner connection between the material of the seal 30 and the carrier 28 is ensured by an axial compression. For this purpose a press ring 44 made of plastic is provided of which the internal circumference is connected through ultrasound welding 46 permanently to a foot area of carrier 28 and which presses the internal circumference of the seal 30 axially against this foot area of carrier 28. This permanent compression as a result of the elasticity or of the clamped-in material (elastomer) guarantees the right seal of the connection between the carrier 28 and the seal 30. To manufacture the sealing unit 24 the carrier 28 can for example be used as an inserted part in an injection molding process in which the sealing material 30 is formed as an injection molding. The connection thus achieved between the carrier 28 and the seal 30 is secured by the subsequent fitting and welding of the press ring 44. To increase the sealing effect the boundary surfaces between the seal 30 on the one side and the foot area of the carrier 28 or the press ring 44 on the other side are corrugated each case.

Contrary to the exemplary embodiment shown the foot area of the carrier 28 can extend radially further outwards beyond the radial positions of the contact pins 14 and feature openings in the area of these contact pins to allow them to pass through. This for example allows the sealing unit 24 to be further mechanically stabilized overall. Further this advantageously enlarges the boundary area between the sealing material 30 and the carrier 28, which is useful for improving the sealing at this boundary surface. Finally with such a "more voluminous" design of the carrier 28 a one-piece embodiment of a carrier 28 with the sleeve extensions projecting downwards into the holes 20 of the head plate 16 is implemented, which in the exemplary embodiment illustrated are provided as extensions of the insulation disk provided separately from carrier 28. The design of a radially widely projecting carrier 28 with the sleeve extensions then to an extent combines the carrier 28 and the insulation disk 40 shown with each other.

Figure 4:
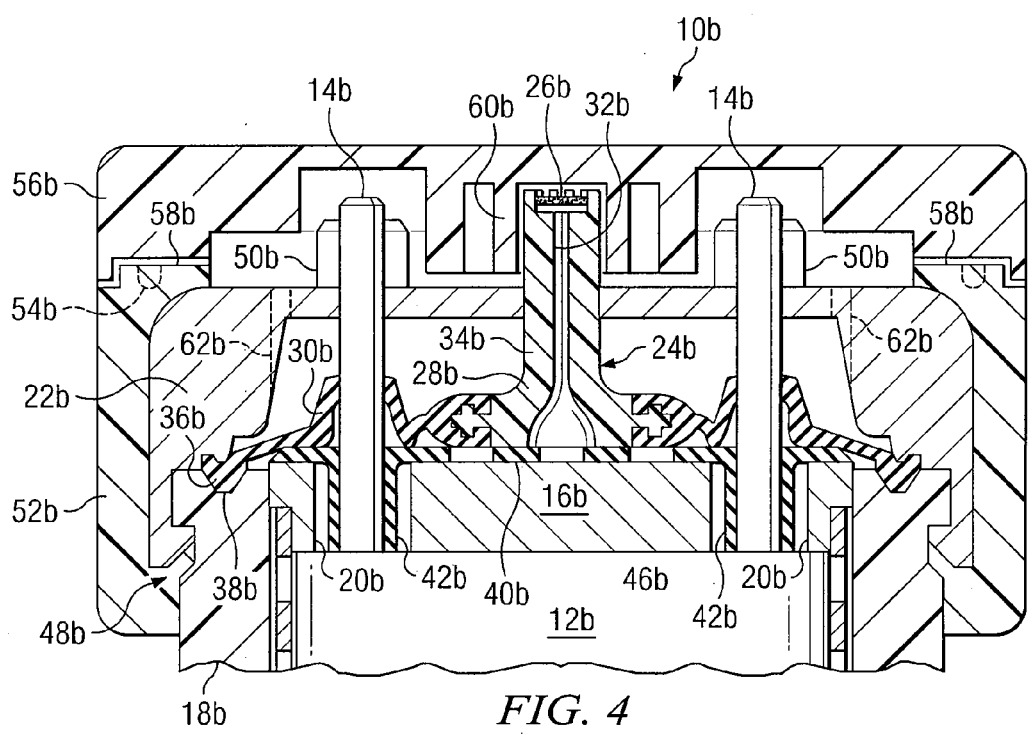

To create an internal connection between the carrier 28 and the seal 30 it is further conceivable for the sealing material to be manufactured as a component in a two-component injection molding procedure together with the carrier 28 or to create an internal connection between these materials by vulcanization (cf. for example. FIG. 4). In these cases under some circumstances a retrospective compression of the seal 30 can be dispensed with.

Also contrary to the exemplary embodiment shown, the welding of the press ring 44 or the press ring 44 itself can also be dispensed with if the press ring 44 or the ring-shaped section of the seal 30 to be clamped in is loaded axially by a material section of the contact module 22. The embodiment shown could for example be modified in such a way that the plastic body of the contact module 22 not only imposes an axial load on the outer circumference of the seal 30 but also indirectly or directly (via an initially loosely inserted press ring) loads the internal circumference of this seal 30 by something like ring-shaped projection protruding axially downwards from the contact module 22 in this area.

On assembly of the actuator the prefabricated sealing unit 24 is placed over the sections of the contact pins 14 protruding from the holes 20. Then by pressing on at the contact module 22 the compression for axial sealing is effected. After the pressing on of the contact module 22 the module is retained by a latching connection 48 provided in the circumferential area. This can for example be provided as in the exemplary embodiment shown with latching all around the circumference or alternatively by individual latching points distributed around the circumference. The ends of the contact pins are then welded to metallic tags 50 of the contact module 22 provided. Before or after this welding a final coating of the upper end of the actuator is undertaken.

The final coating is embodied in the example shown in two sections, namely a plastic injection molding 52 and also a housing cover 56 placed on it and attached by ultrasound welding at 54.

Through the injection molded part 52 the latched connection 48 between the contact module 22 is advantageously secured and under some circumstances the axial compression of the seal 30 is even increased (by shrinkage of the injection molding material when it cools).

This two-part embodiment of the upper area of the actuator housing has the particular advantage that it provides a simple way of making one or more gas exchanger openings 58 in the actuator housing 52 which function as a part of the gas exchange passage passing through this actuator housing. Each such gas exchange opening 58 can for example be provided as a gap between these components. In a simple way the gas exchange opening 58 can be embodied for example like a labyrinth as a gap between these envelope components, as shown in FIG. 1.

A labyrinth-type design of the outer ventilation opening 58 prevents intrusion of solid objects into the interior of this envelope 52, 56. In addition the course of this opening 58, as can be seen in FIG. 1 allows any fluid that has penetrated into the internal space of the envelope 52, 56 such as motor oil, to flow out again of its own accord under the effects of gravity. To this end a lower edge of the opening 58 (as well as the preceding passage) should not climb upwards in any part of its course but should always drop downwards.

Contrary to the exemplary embodiment shown it is in principle conceivable to provide a one-piece plastic injection molding as is usual with conventional fuel injectors, which however is perforated afterwards to create at least one gas exchange opening (e.g. drilled). For a labyrinth-type design of the gas exchange opening a multi-part embodiment is however suitable, as shown in FIG. 1 for example.

The gas exchanger formed from microporous material in the form of the ePTFE membrane 26 is arranged "raised" (at the upper end of the raised carrier section 34). This means that the membrane at 26 is protected from being permanently wetted by the fluid which has intruded. Any fluid which for example penetrates through the gas exchange openings 58 into the inside of the actuator housing at 52, 56 thus runs out again under the force of gravity through these gas exchange openings 58. This only happens down to a specific level however which is essentially determined by the position of the openings 58 (and the actual mounting position of the actuator). As can be seen from FIG. 1, there is a significant height difference between this fluid level and the outside (upper surface) of the membrane 26. This height difference leads to a fluid which wets the membrane flowing out of the membrane which in the exemplary embodiment shown is arranged in a holder section of the upper end of the raised carrier section 34 which features a battlement-shaped side circumferential edge. This "battlement construction" does not prevent the outflow of the fluid from the membrane 26 and protects the membrane during installation of the actuator. Alternatively the membrane 26 (without such protection) could be mounted directly on a flat (horizontal or inclined) end surface of the raised carrier section 34 (e.g. welded).

The housing cover 56 features a wall 60 which surrounds the upper end of the raised carrier section 34 so that any fluid wave which penetrates into the housing cannot reach the membrane 26 just like that. In addition the effect of the surrounding wall 60 is that of a type of "diving bell" such that a fluid rising through the (comparatively narrow) gap between the carrier section 34 and the wall 60 is prevented from rising further to the height of the membrane 26 by the buildup of counter pressure through the volume of air which is then enclosed and compressed in the bell. One factor to consider here is that the decisive volume of air is essentially only determined by the volume over and next to the raised carrier section 34 since the membrane of 26 possesses a significant flow resistance.

As can further be seen from FIG. 1, the bell-type wall 60 extends axially downwards only to a height which lies above the level of any fluid remaining in the housing (defined by the position of the opening 58). The particular advantage of this for example is that fluid remnants are avoided in the bell once the fluid has passed through, which otherwise, if a vacuum were to build up in the actor space, could be sucked in via the membrane 26. Such a vacuum can for example arise as a result of cooling off of the internal combustion engine and thereby of the volume of air enclosed in the actor space.

With the embodiment shown it is not impossible for a fluid which has penetrated via the gas exchanger openings 58 to run via the openings provided for the passage of the contact pins 14 as well as the raised carrier section 34 of the contact module 20 down into the space between the contact module 20 and the sealing unit 24. This is harmless however since the sealing unit 24 prevents a further intrusion of the fluid in the direction of the actor space. If required however run-off passages could also be provided to direct the fluid away from this area. With an inclined mounting position of the actuator, the additional run-off holes shown in FIG. 1 as dashed lines could facilitate such drainage.

In the following description of further exemplary embodiments the same reference numbers are used for similar components but the numbers are supplemented by a lower-case letter to identify the embodiment. In these cases essentially only the differences from the embodiment or embodiments already described are discussed and otherwise explicit reference is made to the description of previous exemplary embodiments.

Figure 3:
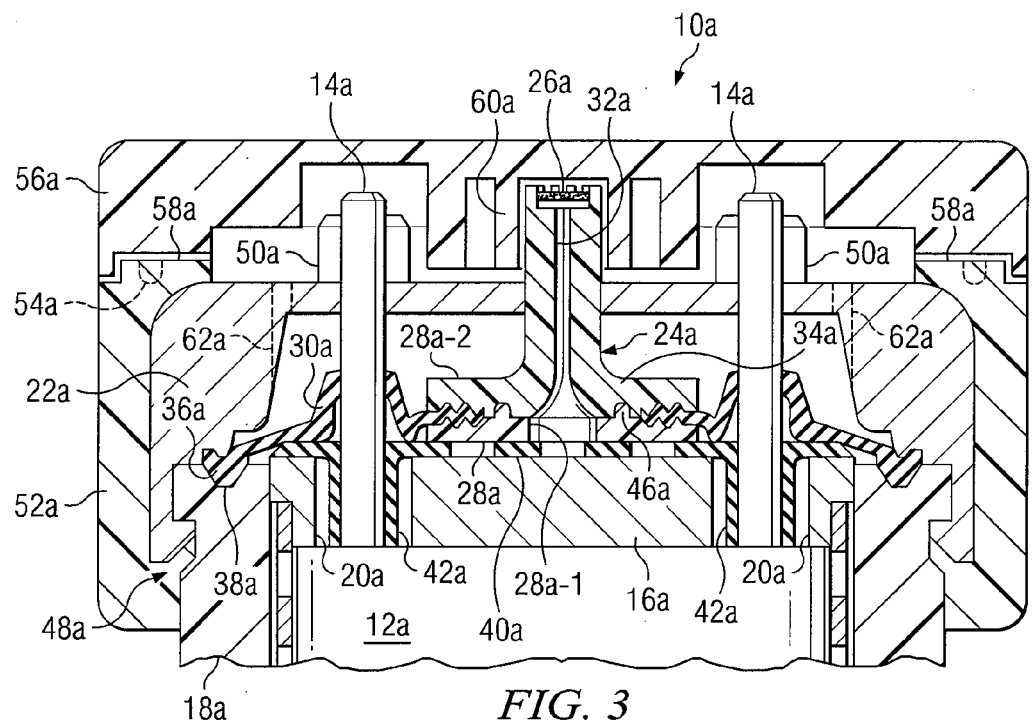
FIG. 3 a cross-sectional view of an upper end section of an actuator in accordance with a further embodiment, and FIG. 4 a cross-sectional view of an upper end section of an actuator in accordance with a further embodiment

FIG. 3 shows the upper end area of an actuator in accordance with a further embodiment. By contrast with and with reference to the embodiment described in FIG. 1, a carrier 28a is formed from two plastic parts 28a-1 and 28a-2 which are permanently connected to each other by means of an ultrasound weld 46a. An inner circumferential edge of a seal 30a is again axially clamped in between these parts 28a-1 and 28a-2. The parts 28a-1 and 28a-2 as well as the seal 30a have been initially manufactured separately and connected together for this embodiment. Before or after this a microporous membrane 26a was attached to the upper end of the projecting carrier part 28a-2. An actuator housing 52a, 56a is provided with a number (e.g. around 3 to 6) gas exchange openings 58a distributed around the circumference. This ensures that even with a comparatively sharply inclined mounting position (relative to the vertical) of the actuator at least one of the openings 58a can work well in operation as an outflow opening for fluids that have intruded. One or more openings 58a by contrast arranged higher in the mounting position can then operate as "air inlet openings" and thereby promote the outflow of the fluid. Alternatively a gas exchange opening 58a extending around the entire circumference could be provided.

FIG. 4 finally shows a further embodiment in which a retroactive compression of a seal 30b is avoided. An internal connection between the seal 30b and a carrier 28b is instead created in this embodiment by vulcanization of the adjoining materials 28b, 30b (which were manufactured in a two-components injector molding process). To increase the border area and thus the sealing effect created by vulcanization, the outer circumference area of the carrier 28b is again designed as a profile.

In summary a sealing concept for a piezoactor with an integrated gas exchanger is provided which is intended especially for use in an environment containing motor oil. The gas exchanger is connected via a carrier to a sealing material. A permanent wetting of the gas exchanger can be avoided by the appropriate geometrical arrangement of the unit (e.g. relatively far up, with drainage facilities).

We claim:

1. An actuator for a fuel injector of an internal combustion engine, comprising:
   a piezoactor with contact pins projecting from the piezoactor and a head arrangement placed on the piezoactor, wherein the head is provided with openings to allow the passage of contact pins,
   at least one gas exchange passage passing through an actuator housing via which a gas exchange between the inside and the outside of the actuator housing is made possible, and
   a sealing unit for sealing the piezoactor placed on the head arrangement comprising openings to allow the passage of the contact pins, wherein the sealing unit comprises a carrier on which a sealing material is arranged which provides a seal around the contact pins and the circumference of the head arrangement and on which a gas exchanger made of microporous material is integrated to create a gas permeability of the sealing unit in such a way that in a mounting position of the actuator any fluid intruding into the gas exchanger can flow out of the gas exchanger through the effect of gravitational force.

2. The actuator in accordance with claim 1, wherein the carrier is made of plastic.

3. The actuator in accordance with claim 1, wherein the sealing material is an elastomer.

4. The actuator in accordance with claim 1, wherein the sealing material is embodied as an injection molding of the carrier.

5. The actuator in accordance with claim 1, wherein the sealing material is manufactured as a component in a two-component injection molding process.

6. The actuator in accordance with claim 1, wherein, between the material of the carrier and the sealing material, an internal connection is created through a vulcanization.

7. The actuator in accordance with claim 1, wherein the sealing material is pressed into the carrier.

8. The actuator in accordance with claim 1, wherein the gas exchanger made of microporous material is welded to the carrier.

9. The actuator in accordance with claim 1, wherein the microporous material is made of ePTFE.

10. The actuator in accordance with claim 1, wherein the gas exchanger made of microporous material is essentially disk-shaped.

11. The actuator in accordance with claim 1, further comprising a contact module placed on the sealing unit for further electrical connection of the contact pins.

12. The actuator in accordance with claim 11, wherein the contact module presses at least sections of the sealing unit against the head arrangement.

13. The actuator in accordance with claim 11, wherein the contact module grips a circumferential area of the head arrangement and is held on this circumferential area by a latching connection.

14. The actuator in accordance with claim 11, wherein the contact module comprises an opening through which an axially projecting section of the carrier featuring the gas exchanger extends.

15. The actuator in accordance with claim 1, wherein the actuator housing comprises an actuator housing section which engages with a section of the carrier featuring the gas exchanger.

16. The actuator in accordance with claim 1, wherein the actuator housing comprises an external coating in which at least one labyrinth-type gas exchanger opening is provided.

17. The actuator in accordance with claim 16, wherein the actuator housing is made up of several components and the gas exchanger opening is provided as a gap between these components.

18. An actuator for a fuel injector of an internal combustion engine, comprising:
   a piezoactor with contact pins projecting from the piezoactor and a head arrangement placed on the piezoactor, wherein the head is provided with openings to allow the passage of contact pins,
   at least one gas exchange passage passing through an actuator housing via which a gas exchange between the inside and the outside of the actuator housing is made possible,
   a sealing unit for sealing the piezoactor placed on the head arrangement comprising openings to allow the passage of the contact pins, wherein the sealing unit comprises a carrier on which a sealing material is arranged which provides a seal around the contact pins and the circumference of the head arrangement and on which a gas exchanger made of microporous material is integrated to create a gas permeability of the sealing unit in such a way that in a mounting position of the actuator any fluid intruding into the gas exchanger can flow out of the gas exchanger through the effect of gravitational force, and
   a contact module placed on the sealing unit for further electrical connection of the contact pins, wherein the contact module presses at least sections of the sealing unit against the head arrangement.

19. The actuator in accordance with claim 18, wherein the contact module grips a circumferential area of the head arrangement and is held on this circumferential area by a latching connection.

20. The actuator in accordance with claim 18, wherein the contact module comprises an opening through which an axially projecting section of the carrier featuring the gas exchanger extends.

21. An actuator for a fuel injector of an internal combustion engine, comprising:
   a piezoactor with contact pins projecting from the piezoactor and a head arrangement placed on the piezoactor, wherein the head is provided with openings to allow the passage of contact pins,
   at least one gas exchange passage passing through an actuator housing via which a gas exchange between the inside and the outside of the actuator housing is made possible,
   a sealing unit for sealing the piezoactor placed on the head arrangement comprising openings to allow the passage of the contact pins, wherein the sealing unit comprises a carrier on which a sealing material is arranged which provides a seal around the contact pins and the circumference of the head arrangement and on which a gas exchanger made of microporous material is integrated to create a gas permeability of the sealing unit in such a way that in a mounting position of the actuator any fluid intruding into the gas exchanger can flow out of the gas exchanger through the effect of gravitational force, and
   an actuator housing section within the actuator housing which engages with a section of the carrier featuring the gas exchanger.

22. The actuator in accordance with claim 21, wherein the actuator housing comprises an external coating in which at least one labyrinth-type gas exchanger opening is provided.

23. The actuator in accordance with claim 22, wherein the actuator housing is made up of several components and the gas exchanger opening is provided as a gap between these components.

* * * * *